United States Patent
Böhm et al.

[11] Patent Number: 5,923,049
[45] Date of Patent: Jul. 13, 1999

[54] TRICHROMATIC SENSOR

[75] Inventors: Markus Böhm, Siegen; Helmut Stiebig, Haiger, both of Germany

[73] Assignee: Cohausz & Florack, Dusseldorf, Germany

[21] Appl. No.: 08/817,632

[22] PCT Filed: Aug. 31, 1995

[86] PCT No.: PCT/EP95/03421

§ 371 Date: May 15, 1997

§ 102(e) Date: May 15, 1997

[87] PCT Pub. No.: WO96/13865

PCT Pub. Date: May 9, 1996

[51] Int. Cl.$^6$ .................................................. H01L 29/04
[52] U.S. Cl. ............................. 257/55; 257/53; 257/440; 257/449; 257/458
[58] Field of Search .............................. 257/53, 55, 184, 257/440, 449, 458

[56] References Cited

U.S. PATENT DOCUMENTS 5,311,047  5/1994  Chang ..................................... 257/198

OTHER PUBLICATIONS

Amorphous Silicon Technology—1994, Materials Research Society Symposium Proceedings, "A Novel a–Si(C):H Color Sensor Array", by Q. Zhu, H. Stiebig, P. Rieve, H. Fischer, M. Böhm, vol. 336, pp. 842–848, 1994.

Electron Device Letters, An Amorphous SiC/Si Two–Color Detector, H. Tsai, S. Lee, W. Lin, IEEE, vol. EDL–8, No. 8, Aug. 1987, pp. 364–367.

Electron Device Letters, A Vertical–Type a–Si:H Back–to–Back Schottky Diode for High–Speed Color Image Sensor, Y. Fand, S. Hwang, Y. Chen, L. Kuo, IEEE, vol. 12, No. 4, Apr., 1991, pp. 171–174.

Sensors and Control For Automation, "New Type of Thin Film Color Image Sensor", by Q. Zhu, H. Stiebig, P. Rieve, J. Giehl, M. Sommer, M. Böhm, SPIE, vol. 2247, (1994)/301, pp. 301–310.

"Amorphous SiC/Si Three–Color Detector", by H. Tsai, S. Lee, Appl. Phys. Lett., vol. 52, No. 4, Jan. 1988, pp. 275–277.

"Tunable Photodetectors Based on Amorphous Si/SiC Heterostructures", by G. de Cesare, F. Irrera, F. Lemmi, F. Palma, IEEE Transactions on Electron Devices, vol. 42, No. 5, May, 1995, pp. 835–840.

*Primary Examiner*—Minh Loan Tran
*Attorney, Agent, or Firm*—Proskauer Rose LLP

[57] ABSTRACT

The invention relates to a photo sensitive electronic component based on amorphous silicon and its alloys, comprising two, in respect to each other antiserially arranged, p-i-n or n-i-p or Schottky-contact structures, in which in each case the active layers are arranged in the normal way in the direction of light incidence, whereby in the area of the first structure in the direction of light incidence, the charge carriers generated by blue light are collected for a first (V1) voltage; and in the area of the second structure in the direction of light incidence, the charge carriers generated by red or green light are collected for a second (V2) or a third (V3) voltage, and whereby at least one of the two intrinsically conducting layers is constructed from two partial layers. The object of creating better spectral selectivity is achieved in that in the partial layer (I) which is in front in the direction of light incidence, a higher product from charge carrier mobility and life-time ($\mu$-tau product); and in the partial layer (II) which is at the rear in the direction of light incidence, a lower product from charge carrier mobility and life-time ($\mu$-tau product) is present, in such a way that the two partial layers (I, II) in the presence of an electrical field, have different collection lengths for the charge carriers so that in the partial layer (I) which is in front in the direction of light incidence, increasingly green light, and in the partial layer (II) which is at the rear in the direction of light incidence, increasingly red light is absorbed.

11 Claims, 5 Drawing Sheets

TRICHROMATIC SENSOR

FIELD OF THE INVENTION

The invention relates to a component based on amorphous silicon and its alloys, comprising two, in respect to each other antiserially arranged, p-i-n or n-i-p or Schottky-contact structures, in which the active layers are in each case arranged in the normal way in the direction of light incidence, whereby in the area of the first structure in the direction of light incidence, the charge carriers generated by blue light are collected for a first (V1) voltage; and in the area of the second structure, in the area of light incidence, the charge carriers generated by red or green light are collected for a second (V2) or a third (V3) voltage, and whereby at least one of the two intrinsically conducting layers is constructed from two partial layers.

BACKGROUND OF THE INVENTION

A component of this type is known from the essay "New type of thin film colour image sensor", Q. ZHU, H. Stiebig, P. Rieve, J. Giehl, M. Sommer, M. Böhm; Conference Europto—Sensors and Control for Advanced Automation II, Frankfurt/Main, 20–24 June 1994.

Compared with components of crystalline silicon, photo sensitive electronic components based on amorphous silicon (a-Si:H) have the advantage of significantly increased absorption of visible light. Basically such a photo sensitive electronic component consists of two PIN diodes connected antiserially in respect to each other, whereby the alternatives NIPIN or PINIP are known; or of two metal-semiconductor junctions (Schottky contacts) connected to each other antiserially.

Technologically, such a component is produced by separating a multitude of a-Si:H layers at low temperature (typically 250° C.) by means of the PECVD (Plasma Enhanced Chemical Vapour Deposition) process. Deposition takes place at first for example on an insulating substrate, usually glass, by connecting a translucent conductive oxide layer (TCO) which later establishes a contact for an electrical voltage to be applied externally to the component. By applying an alternating field, a plasma is generated at the PECVD reactor by the gas $SiH_4$ (silane) being decomposed into silicon radicals and hydrogen. In this process, silicon condenses on the substrate as an amorphous film containing hydrogen. Starting from this, by adding phosphine, an n-doped layer can be produced; or by adding boroethane, a p-doped layer can be produced. In addition, it is well known to increase the band gap of the amorphous silicon by adding methane ($CH_4$) to the silane, or to decrease the band gap by adding germane (Ge $H_4$)

The multilayer component produced in this way, having the desired layer sequence, is now penetrated by radiation of visible light in such a way that the direction of light incidence is perpendicular to the plane of the layers. Because the absorption coefficient of the sensor material depends on the wave length of the incoming light and on the band gap of the sensor material, different penetration depths of light into the semiconductor material results. This leads to blue light (wavelength approx. 450 nm) having a significantly lesser penetration depth (absorption length) than green or red light. By selecting the respective size and polarity of the exterior direct voltage applied to the component, and therefore the interior electrical field, a spectral sensitivity of the component can be attained. For example by applying respective voltages to the element, a sensitivity for RGB light (red, green, blue) in the multilayer structure can be attained. In this the principal collecting region of the light-generated charge carriers along the length of the component and consequently its spectral sensitivity, is shifted, depending on the exterior voltage applied.

In order to optimise a NIPIN structure in respect of a trichromatic sensor, it is known from the above-mentioned report, on both sides of the p-doped intermediate layer, to additionally provide intrinsically conducting defect layers in whose thickness region the band gap is increased in comparison to the remaining intrinsically conducting layers (e.g. from 1.74 eV to 1.9 eV). This leads to an improved red/green separation in the NIP structure in front in the direction of light incidence, or to an improved red/green separation in the subsequent PIN structure in the direction of light incidence, (so-called band-gap engineering).

From U.S. Pat. No. 5,311,047 a photo sensitive electronic component based on amorphous silicon with NIPIN structure is known.

From Applied Physics Letters 52(4) 1988, 275–277, a heterojunction component (phototransistor) of the type NIPIN is known which comprises two additionally-inserted intrinsically conducting layers. From this it is known that in the first junction preferably blue light, and in the second junction preferably green or red light, are absorbed. The second intrinsically conducting layer serves to increase blue absorption.

It is the object of the invention to describe an electronic component of the type mentioned in the introduction, as well as a method for its manufacture which ensures that under economic fabrication conditions a component sensitive to RGB colours is created which features a high spectral separation for RGB colours with negligible infrared/ultraviolet contributions to the output signal.

SUMMARY OF THE INVENTION

This object is achieved according to the invention by the two partial layers, in the presence of an electrical field, having different collection lengths for the charge carriers, in such a way that in the partial layer which is in front in the direction of light incidence, a higher product from charge carrier mobility and life, and in the partial layer which is at the rear in the direction of light incidence, a lower product from charge carrier mobility and life is present, or that at least one of the two intrinsically conductive layers is formed from two partial layers which on the basis of respective doping, in particular with $Si_xGe_{1-x}$, have such different mobilities that the $\mu$-tau products in the two partial layers differ from each other by at least a factor of 10, whereby the partial layer with the higher $\mu$-tau product is in front in the direction of light incidence.

The invention is characterized in that due to the splitting up of at least one of the two intrinsically conducting layers of the component, into two partial layers, blue/green separation or green/red separation is improved. In contrast to known processes (e.g. by influencing the absorption or recombination behaviour through a partial increase of the band gap "band-gap engineering") or by incorporating additional defect layers, the variation of the $\mu$-tau product according to the invention has the decisive advantage of making possible a significantly improved spectral separation and the desired linear behaviour.

As a result of this, the primary colours can be separated with certainty in the case of both high and low light intensity. The solution according to the invention results in a component with a linear connection between the photo voltage for the respective spectral peak and the photon flow. This is the case over several orders of magnitude of the phonon flow. Beyond this, there is no linear interdependence of the spectral peaks. The linearity on the one hand and the linear independence of the spectral peaks on the other hand are the very reasons that make it possible to be able to use such a component at all in practice for colour recognition under various conditions of illumination.

By incorporating an area with low, free mobility of the charge carriers in the rear structure in the direction of light incidence, charge carriers can only be extracted during higher voltage and thus higher electrical field. Holes which are generated in the front part by light of short wavelength drift to the intermediate layer. The electrons reach the barrier layer of the rear structure because no recombination partners are generated in the rear part. Longwave light (red) generates predominantly in this area, so that the charge carriers recombine as a result of the lower $\mu$-tau product. Only with higher field strengths is it possible for the holes to drift to the intermediate layer. As a result, red/green separation occurs in the rear structure.

When incorporating suitable materials and alloys (e.g. a-Si:H/a-Si$_x$Ge$_{(1-x)}$:H) with different free mobilities in the bands, in this partial layer, at lower voltages, charge carriers can be collected less well due to the lower $\mu$-tau product. By contrast, these charge carriers can be collected in preference in the case of higher voltages.

In the partial layer with the higher $\mu$-tau product, preferably green photons are collected, while in the rear area in the direction of light incidence, preferably the red charge carriers are collected. Due to the different refractive indices, depending on the wavelength, of a-Si:H/a-Si(C):H and a-Si$_x$Ge$_{1-x}$:H, for the frontal partial layer of the subsequent intrinsically conducting layer an area of a certain thickness can be determined in which more green photons than red photons are absorbed. The charge carriers generated can be extracted at lower negative voltages and determine the maximum spectral sensitivity. With higher negative voltages the maximum spectral sensitivity is determined by the charge carriers which are generated in the rear partial layer of this intrinsically conducting layer.

The maximum spectral sensitivity for longwave light can be set by the thickness of the layer of the Si$_x$Ge$_{1-x}$ material, by the germanium content in this area and possibly by gradation.

With the component according to the invention, by applying three different voltages, three space charging zones located at various depths in the component can be obtained as a result, therefore yielding outstanding spectral selectivity. A particular advantage consists of the linearity extending over more than five orders of magnitude of luminous intensity. In addition, the component according to the invention has a low dark current and a high dynamic range (>120 dB, in respect of 1000 lux). A further advantage consists of being able to preset the spectral sensitivity in a customer-specific manner. Of particular significance is the fact that selection of spectral components is possible without the use of additional optical filters.

Preferred embodiments are stated in the dependent claims.

A NIPIN or a PINIP structure can be considered as preferred variants of photosensitive components which according to the invention are modified by the partial layers with a different $\mu$-tau product. Technologically, the $\mu$-tau variation is preferably achieved by alloying germanium into the amorphous silicon (a-Si$_x$Ge$_{1-x}$:H).

In order to improve blue/red separation as well as for improved quantum efficiency, the intrinsically conducting layer of the front structure in the direction of light incidence, may consist of a carbonised layer (a-Si(C):H), so that in addition to the $\mu$-tau optimisation, an adaptation of the band gap also takes place.

The particularly preferred embodiment of the invention provides that the component is part of a colour sensor in which the sandwich structure comprising the component is arranged on the surface of an integrated circuit. Combining a crystalline component (for example an ASIC) with the multilayer component produced according to low-temperature PECVD technology, results in a simple combination which can be produced economically and which achieves high resolution as a picture-yielding colour sensor. In this, each surface element of the photosensitive component, according to the micro structure of the integrated circuit or the ASIC, acts as a single pixel element. Colour selectivity is set by the voltage, presettable by the circuit applied to the region of the pixel area. The result is a so-called thin film on ASIC (TFA) sensor system which combines the advantages of traditional ASICs made of crystalline silicon with an optical sensor based on amorphous silicon.

Below, the invention is explained in more detail by means of a drawing, as follows:

DETAILED DESCRIPTION OF THE INVENTION

Figure 1:
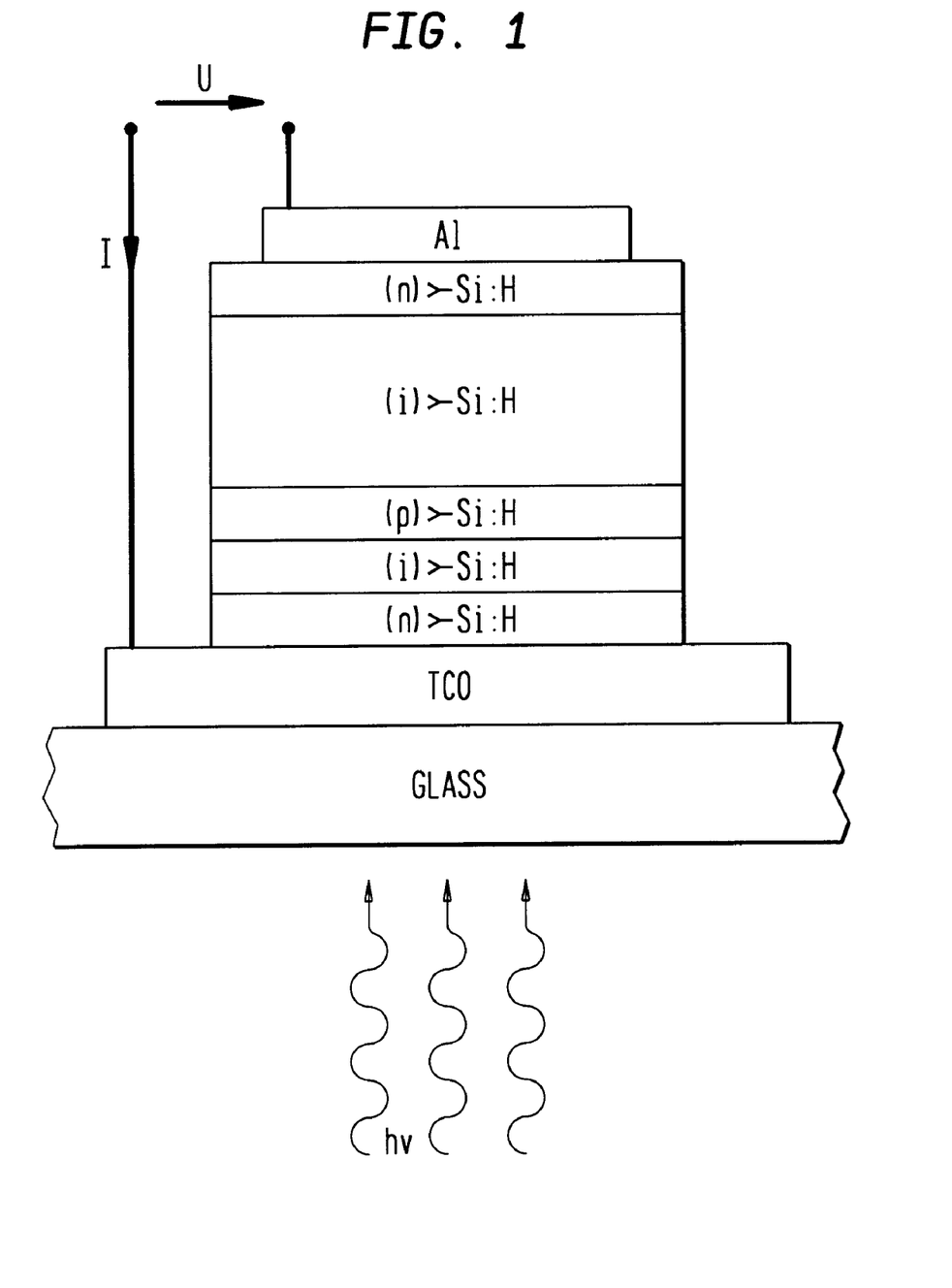
FIG. 1 is a schematic diagram to illustrate the layer construction of a photosensitive electronic component according to prior art

FIG. 1 shows a cross section through a NIPIN layer system in which the NIPIN layer sequence is deposited on a carrier (glass). The glass substrate is subsequently coated with a TCO layer comprising a light-transmitting, conductive oxide. On top of this, subsequently, the individual amorphous silicon layers are deposited in the sequence as shown in FIG. 1.

The deposition process is by means of the known PECVD technology in which amorphous silicon is deposited in the desired layer thickness at relatively low temperature (approx. 250° C.).

Back contact is established by an aluminium electrode to which an exterior electrical voltage U is applied which drives a current I that flows into the element, whereby the TCO layer forms the reference potential. In this way the arrangement acts like an antiserially connected combination of two PIN diodes.

As is also shown in FIG. 1, light incidence is through a glass substrate into the NIPIN layer system, perpendicular to the surfaces of the layers.

Figure 2A:
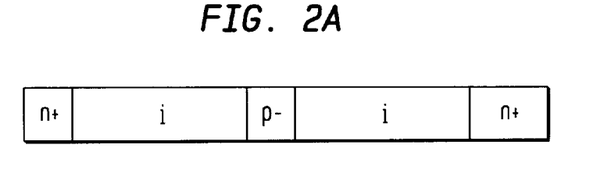
FIG. 2a shows the spatial arrangement of the individual layers of the multilayer component
Figure 2B:
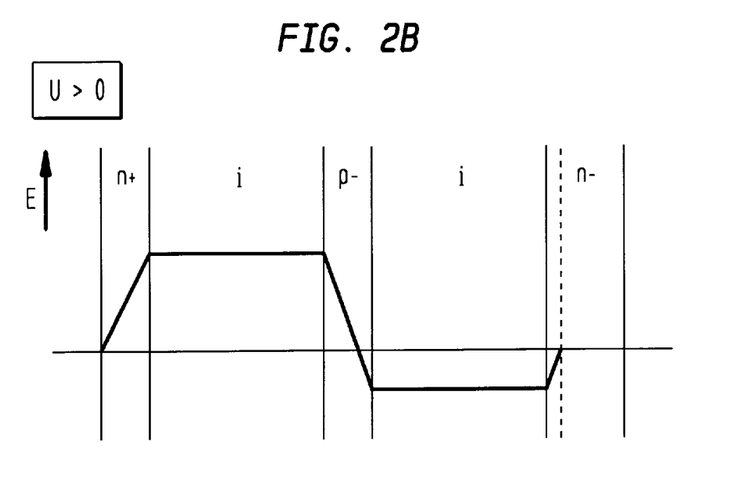
FIG. 2b shows the local flow of the electrical field strength at U>0.
Figure 2C:
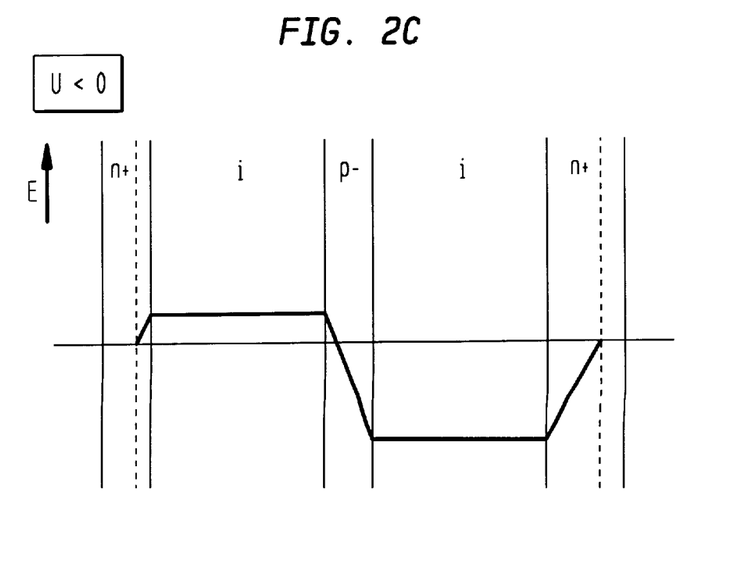
FIG. 2c shows the local flow of the electrical field strength at U<0

A schematic diagram of the semiconductor structure is shown in FIG. 2a. In the n-doped regions forming the barrier layers of the NIPIN component, there is strong doping. In these areas no charge carrier collection takes place because there is a high recombination probability between electrons and holes, corresponding to the high defect densities. In that location, because of the doping concentration, assumed to be constant, as is shown in FIGS. 2b and 2c respectively, a linear increase in the electrical field strength takes place. In the intrinsically conducting regions assumed to be free of space charges, there is a spatially approximately constant distribution of the electrical field strength, whereby the contribution to the space charge by mobile charge carriers, defects and impurities is negligible. By means of the electrical field, photo-generated charge carriers are collected as the primary photo current. Thermally generated charge carriers contribute to the dark current. Because the NIPIN structure can be regarded as consisting of two antiserially connected PIN diodes, the major drop in voltage occurs in the region of the diode polarised in the direction of blocking. By contrast, the electrical field in the diode poled in the direction of transmission is negligible. As can be seen from FIGS. 2b and 2c, provided the thermally-generated charge carriers are negligible, the field strength existing in the region of the intermediate p-layer is a function of the applied voltage U, whereby in the centre of the p-layer at a certain location, the field strength has a zero passage.

Depending on the voltage applied externally to the element, the flow of the electrical field strength is either according to FIG. 2b (U>0) or according to FIG. 2c (U<0). If now, according to FIG. 2b a positive voltage, for example +2 volt, is applied to the element shown in FIG. 1, then the front diode is poled in the direction of blocking, so that inside it a strong electrical field forms in which charge carriers can be separated. Because this region is located in the front in the direction of light incidence, the spectral components of the light with lower absorption length, i.e. blue light, are absorbed there.

By contrast, if a negative voltage is applied to the component, the space charge zone forms in the region of the rear PIN diode, so that there the light is absorbed in the green or red spectral range which has a greater penetration depth.

Figure 3:
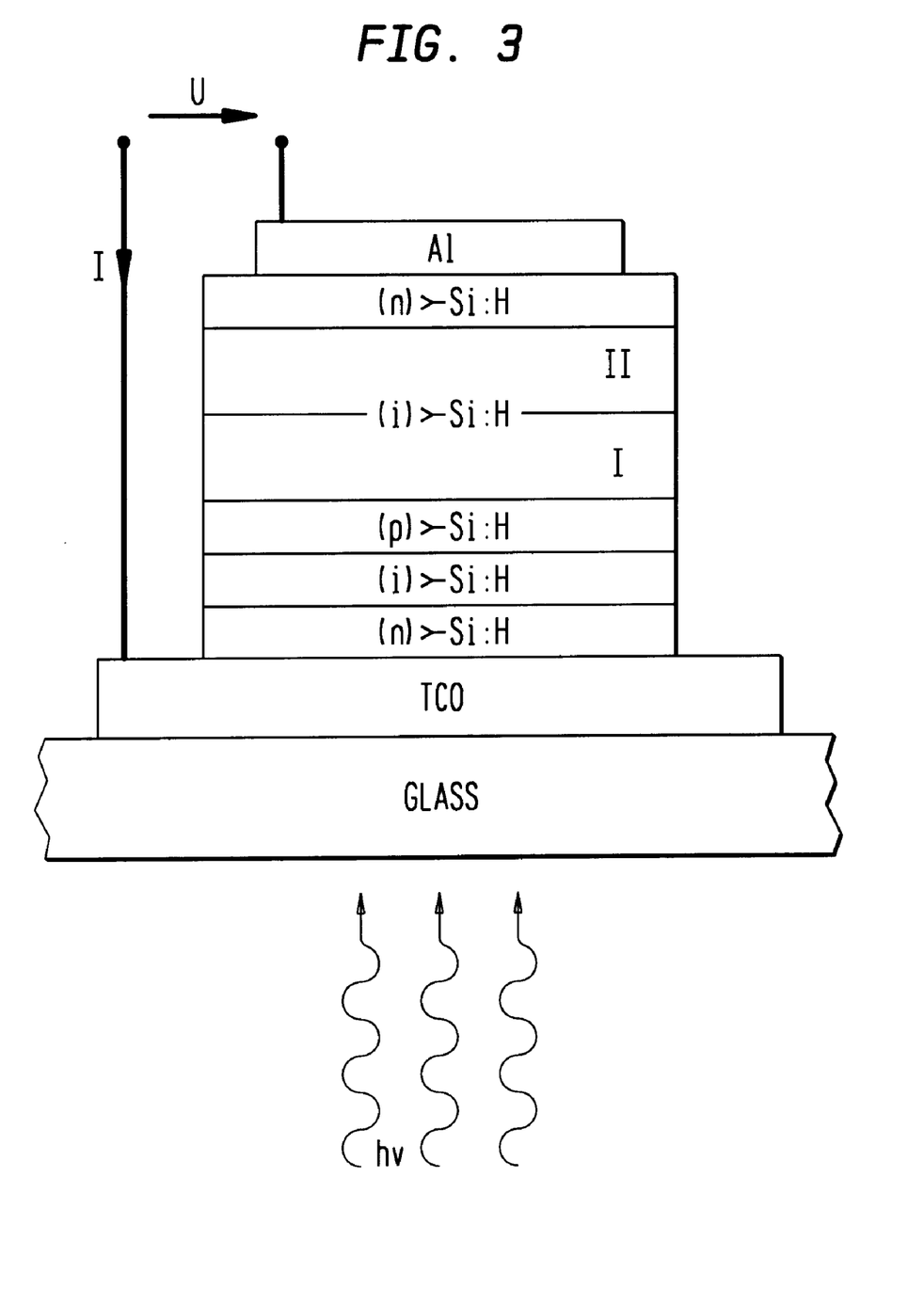
FIG. 3 is a schematic diagram to illustrate the layer construction of a photosensitive electronic component according to the invention

Starting from this, FIG. 3 shows an embodiment of a photo-sensitive electronic component according to the invention. Supplementary to the component shown in connection with FIG. 1, according to FIG. 3 the intrinsically conducting rear layer in the direction of light incidence, is subdivided into two partial layers I, II. Subdivision takes place because in partial layer I there is a larger $\mu$-tau product than in partial layer II. This connection is evident from FIG. 4c, by the $\mu$-tau characteristic drawn in bold from which the gradation in the areas I, II can be recognised.

Figure 4A:
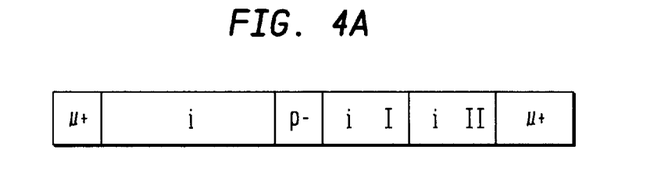
FIG. 4a shows the spatial arrangement of the individual layers of the multilayer component
Figure 4B:
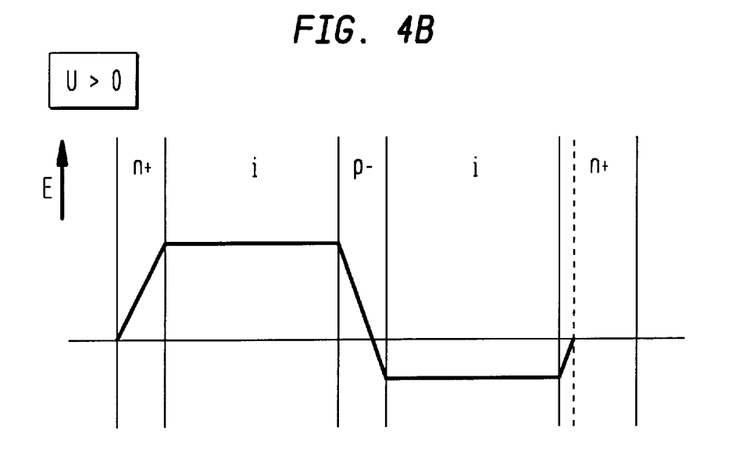
FIG. 4b shows the local flow of the electrical field strength at U>0

With otherwise identical basic functions of the component, this leads to the following mode of operation:

Corresponding to FIG. 4b, charge carriers generated by blue light are again collected in preference in those circumstances where a positive exterior voltage is applied to the component.

Figure 4C:
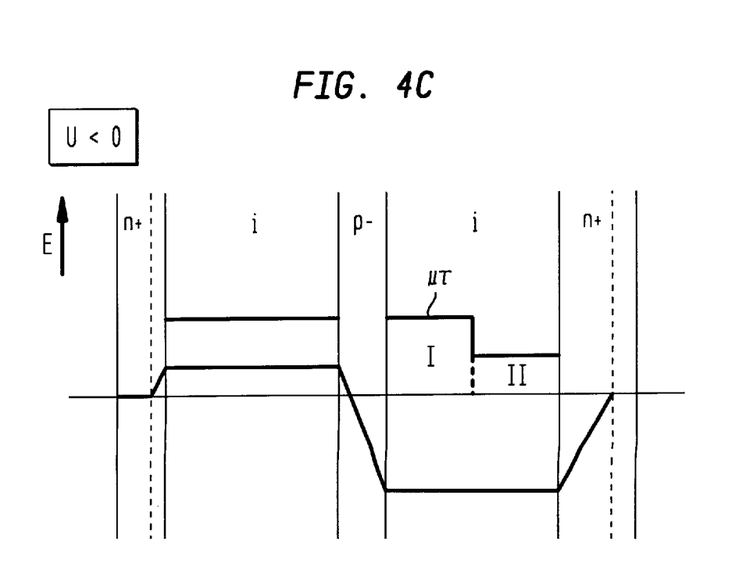
FIG. 4c shows the local flow of the electrical field strength at U<0, as well as the local flow of the $\mu$-tau product.

By contrast, FIG. 4c shows the case where a negative voltage U is applied to the component. Let us first examine the case where the amount of negative voltage is relatively small, for example where a voltage of −0.5 volt is applied to the component. By incorporating materials with low free mobilities in the rear area of the second intrinsically conducting layer (partial layer II) and the lower $\mu$-tau product resulting therefrom, collection of charge carriers which are generated by light with high penetration depth (corresponding to the red light) is worsened. Therefore, in the case of such a voltage, in preference, charge carriers are collected which are generated by green photons. Because partial layer I does not contain germanium, the band gap is so large there that red photons cannot be absorbed or can only be absorbed insufficiently.

By contrast, if the amount of negative voltage rises, then in preference red charge carriers can be collected. Due to the fact that additionally, the band gap in partial layer II is narrow as a result of the layer containing germanium, red photons are especially well absorbed there.

Thus gradating the $\mu$-tau product in the area of the rear intrinsically conducting layer, results in a significant improvement in the red/green separation and therefore, in combination with the blue absorption occurring in the region of the frontal intrinsically conducting layer, provides the possibility of a trichromatic sensor with very high spectral selectivity.

Starting with the basic functions, as described above, of the component according to the invention, preferably the following improvements are also provided:

The intrinsically conducting layer of the NIP diode located in front in the direction of light incidence, can consist of a carbonised layer so that improved blue/red separation results. To reduce the dark current, an area with a narrower band gap can be provided within this intrinsically conducting layer.

In order to improve the maximum quantum efficiency, the n-layer of the front structure in the direction of light incidence may be carbonised or may be made as a micro crystalline layer whereby the middle p-layer, too, may be carbonised.

In addition, the sensitivity of the first structure as regards blue absorption may be moved towards shorter wavelengths by a slight doping in the transitional area between the intrinsically conducting layer and the middle p-layer.

In order to optimise spectral selectivity, a gradated a-$Si_xGE_{1-x}$:H layer or further undoped layers may be placed behind or in front of the a-$Si_xGE_{1-x}$:H layer.

Figure 5:
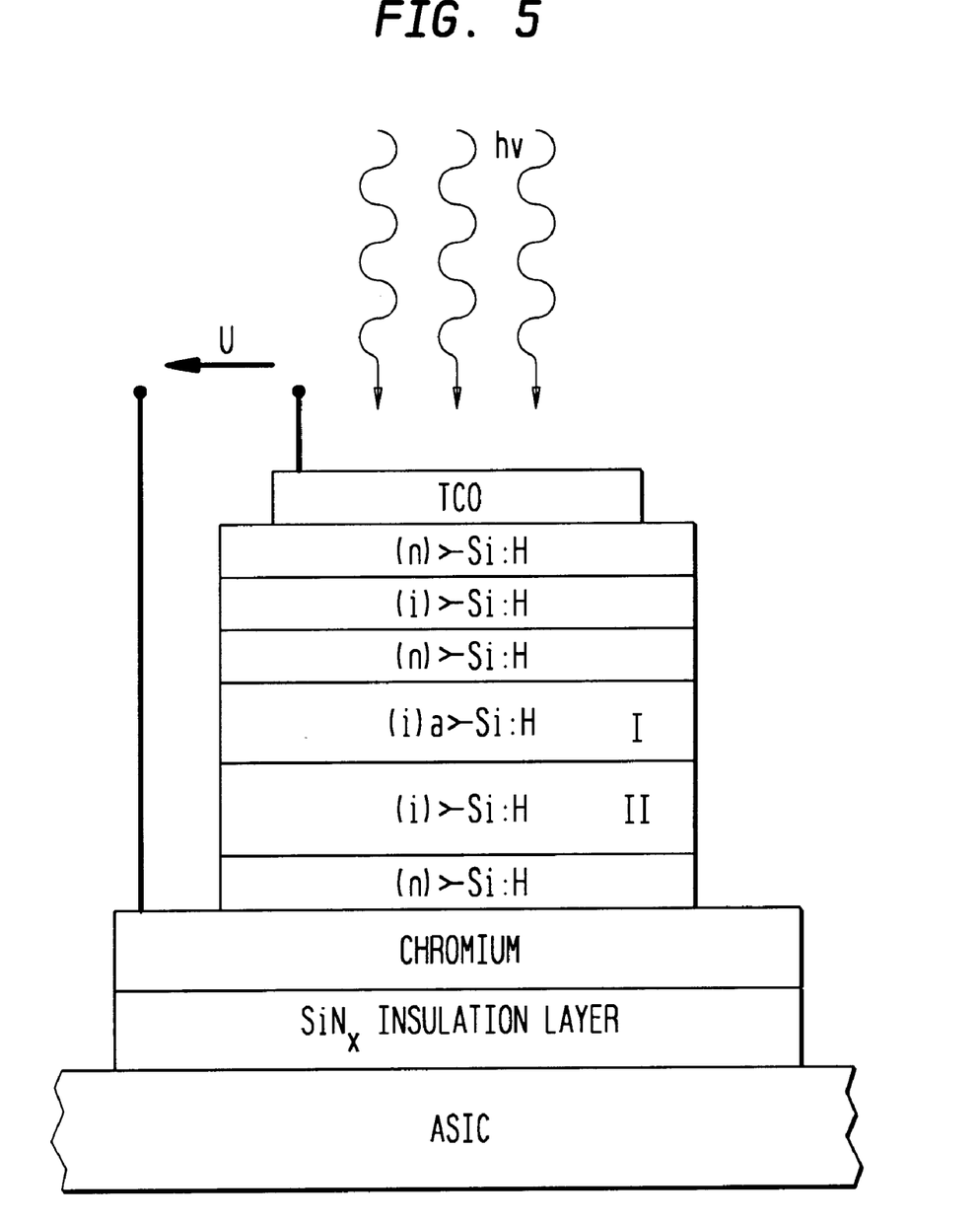
FIG. 5 is a schematic diagram to illustrate the layer construction of the combination of a photosensitive electronic component according to the invention with an integrated circuit.

Starting from the component described in the context of FIG. 3, a chromatic picture sensor, shown in FIG. 5, can be created, in which the multilayer structure as described is placed as a substrate, in the shape of an ASIC, on top of an integrated circuit. The production process takes place by interconnecting an insulation layer and a metal layer.

In this, the layer sequence during deposition is the other way round than that described in connection with FIG. 1 or 3 respectively.

According to FIG. 5, the light then enters the structure from above. Depending on the selection of the optical cell by the crystalline ASIC structure, for each pixel element, depending on the applied voltage, different spectral behaviour results. In this way the irradiated light can be analysed, pixel by pixel, in regard to its spectral components, and the light signal converted in this way may be further processed electrically.

We claim:

1. A photosensitive electronic component based on amorphous silicon and its alloys, comprising two, in respect to each other antiserially arranged, p-i-n or n-i-p or Schottky-contact structures, in which the active layers are in each case arranged in the direction of light incidence, whereby in an area of a first structure seen in the direction of light incidence, the charge carriers generated by blue light are collected for a first voltage; and in an area of a second structure in the direction of light incidence the charge carriers generated by green or red light are collected for a second or a third voltage, and whereby the intrinsically conducting layer of the second structure is constructed from first and second partial layers, characterized in that the first partial layer which is in front in the direction of light incidence, has a $\mu$-tau product higher than that of the second partial layer, which is at the rear in the direction of light incidence, by at least a factor of 10, in such a way that the two partial layers in the presence of an electrical field, have different collection lengths for the charge carriers so that in the first partial layer which is in front in the direction of light incidence, increasingly green light, and in the second partial layer which is at the rear in the direction of light incidence, increasingly red light is absorbed, wherein said $\mu$-tau product represents a charge carrier mobility and life-time product.

2. A component according to claim 1, characterized in that the proportion of the $\mu$-tau products in the first and second partial layers is 1:10 to 1:100.

3. A component according to claim 1, characterized in that the value of the $\mu$-tau product in the first partial layer is between $10^{-7} cm^2 V^{-1}$ and $10^{-6} cm^2 V^{-1}$, and in the second partial layer between $10^{-8} cm^2 V^{-1}$ and $10^{-7} cm^2 V^{-1}$.

4. A component according to claim 1, characterized in that said amorphous silicon of said component being intrinsically conducting, and the setting of the $\mu$-tau product occurs by influencing the charge carrier mobility in respect to the intrinsically conducting amorphous silicon, by incorporating foreign atoms, in particular $a\text{-}Si_xGe_{(1-x)}:H$.

5. A component according to claim 1, further comprising a glass substrate, characterized in that between the glass substrate and the n-i-p-i-n or p-i-n-i-p layer sequence, a further layer of a transparent, conductive oxide (TCO) is provided.

6. A component according to claim 1, characterized in that in a region of said intrinsically conducting layer a further intrinsically conducting layer of a-Si(C):H with an increased band gap is provided.

7. A component according to claim 1, characterized in that said intrinsically conducting layer being an a-Si(C):H layer with an increased band gap in the range of 1.72 to 1.95 eV.

8. A component according to claim 1, characterized in that said intrinsically conducting layer being a layer of micro crystalline or carbonised amorphous silicon.

9. A colour sensor using a component according to claim 1, characterized in that the photosensitive electronic component is deposited on the surface of an integrated circuit.

10. A colour sensor according to claim 9, characterized in that the integrated circuit is an ASIC.

11. A colour sensor using a component according to claim 1, further including a carrier substrate below the n-i-p-i-n or p-i-n-i-p layer sequence, characterized in that quartz, metal Si-wafer, GaAs or plastic is used as said carrier substrate.

* * * * *

UNITED STATES PATENT AND TRADEMARK OFFICE
CERTIFICATE OF CORRECTION

PATENT NO.    : 5,923,049

DATED         : July 13, 1999

INVENTOR(S)   : Markus Bohm

It is certified that error appears in the above-identified patent and that said Letters Patent is hereby corrected as shown below:

On the Title page, item --[73] Assignee: Cohausz & Florack, Dusseldorf, Germany

-- should be deleted.

Signed and Sealed this

Eleventh Day of April, 2000

Attest:

Attesting Officer

Q. TODD DICKINSON

Director of Patents and Trademarks